(12) United States Patent
Nejad et al.

(10) Patent No.: US 6,940,748 B2
(45) Date of Patent: Sep. 6, 2005

(54) STACKED 1T-NMTJ MRAM STRUCTURE

(75) Inventors: Hasan Nejad, Boise, ID (US);
Mirmajid Seyyedy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 60 days.

(21) Appl. No.: 10/146,113

(22) Filed: May 16, 2002

(65) Prior Publication Data

US 2003/0214835 A1 Nov. 20, 2003

(51) Int. Cl.[7] .............................................. G11C 11/14
(52) U.S. Cl. ........................ 365/171; 365/97; 365/87; 365/66; 365/55; 365/48; 365/33
(58) Field of Search ............................ 365/171, 97, 87, 365/66, 55, 48, 33

(56) References Cited

U.S. PATENT DOCUMENTS 4,809,225 A * 2/1989 Dimmler et al. ............ 365/149
5,969,380 A   10/1999 Seyyedy (Continued)

FOREIGN PATENT DOCUMENTS

| EP | 1 109 170 | 6/2001 | | |
|---|---|---|---|---|
| EP | 1 109 170 A2 | 6/2001 | | |
| EP | 1 321 941 | 6/2003 | | |
| JP | 2000 187976 | 12/1998 | | |
| JP | 2001217398 | 3/2000 | | |
| JP | 2001357666 | 6/2000 | | |
| JP | 02002170376 A | * | 6/2002 | ........... G11C/11/15 |
| JP | 02003100071 A | * | 4/2003 | ........... G11C/11/15 |
| JP | 2004023062 | * | 1/2004 | ......... H01L/27/105 |

OTHER PUBLICATIONS

SaiedTehrani, "MTJ based MRAM System Design", Mar. 2001, Motorola Labs (Physical Sciences Research Lab), Session G5–Recent Applications and Sciences of M<agnetic Tunnel Junctions, p. 1 of 1.*

(Continued)

*Primary Examiner*—Viet Q. Nguyen
(74) *Attorney, Agent, or Firm*—Dickstein Shapiro Morin & Oshinsky LLP

(57) ABSTRACT

This invention relates to MRAM technology and new variations on MRAM array architecture to incorporate certain advantages from both cross-point and 1T-1MTJ architectures. The fast read-time and higher signal-to-noise ratio of the 1T-1MTJ architecture and the higher packing density of the cross-point architecture are both exploited by combining certain characteristics of these layouts. A single access transistor 16 is used to read multiple MRAM cells, which can be stacked vertically above one another a plurality of MRAM array layers arranged in a "Z" axis direction.

49 Claims, 4 Drawing Sheets

U.S. PATENT DOCUMENTS

| | | | | |
|---|---|---|---|---|
| 6,349,054 B1 | * | 2/2002 | Hidaka | 365/173 |
| 6,356,477 B1 | | 3/2002 | Tran | |
| 6,445,613 B1 | | 9/2002 | Nagai | |
| 6,473,336 B1 | * | 10/2002 | Nakajima et al. | 365/171 |
| 6,570,795 B1 | * | 5/2003 | Fricke et al. | 365/200 |
| 6,577,529 B1 | * | 6/2003 | Sharma et al. | 365/158 |
| 6,608,776 B2 | * | 8/2003 | Hidaka | 365/171 |
| 6,631,085 B2 | * | 10/2003 | Scheuerlein et al. | 365/175 |
| 6,671,213 B2 | * | 12/2003 | Ohtani | 365/200 |
| 6,680,862 B2 | * | 1/2004 | Hidaka | 365/158 |
| 6,693,825 B1 | * | 2/2004 | Sharma et al. | 365/158 |
| 6,717,222 B2 | * | 4/2004 | Zhang | 257/390 |
| 6,724,653 B1 | * | 4/2004 | Iwata et al. | 365/158 |
| 6,754,124 B2 | * | 6/2004 | Seyyedy et al. | 365/214 |
| 2000/0012228 | | 8/2001 | Perner | |
| 2001/0012228 A1 | * | 8/2001 | Perner | 365/210 |
| 2001/0038548 A1 | * | 11/2001 | Perner et al. | 365/66 |
| 2002/0080641 A1 | * | 6/2002 | Asao et al. | 365/63 |
| 2002/0093845 A1 | * | 7/2002 | Matsuoka et al. | 365/97 |
| 2002/0132375 A1 | * | 9/2002 | Doan et al. | 438/3 |
| 2002/0135018 A1 | * | 9/2002 | Hidaka | 257/359 |
| 2002/0140000 A1 | * | 10/2002 | Watanabe | 257/200 |
| 2002/0140016 A1 | * | 10/2002 | Cha | 257/302 |
| 2002/0140060 A1 | | 10/2002 | Asao et al. | |
| 2003/0047765 A1 | | 3/2003 | Campbell | |
| 2003/0058686 A1 | * | 3/2003 | Ooishi et al. | 365/171 |
| 2003/0067013 A1 | | 4/2003 | Ichihara et al. | |
| 2002/0103377 A1 | | 6/2003 | Kajiyama | |
| 2003/0206453 A1 | * | 11/2003 | Joo | 365/200 |
| 2003/0223292 A1 | * | 12/2003 | Nejad et al. | 365/200 |
| 2003/0227795 A1 | * | 12/2003 | Seyyedy et al. | 365/173 |
| 2004/0213044 A1 | * | 10/2004 | Seyyedy et al. | 365/173 |

OTHER PUBLICATIONS

How Magnetic RAM Will Work (accessed Nov. 19, 2001) <http://www.howstuffworks.com/mram2.htm>.

MTJ Based MRAM System Design (accessed Nov. 19, 2001) <http://www.aps.org/meet/MAR01/baps/abs/S2550004.html>.

Motorola Demonstrates Revolutionary Memory Technology (accessed Nov. 19, 2001) <http://www.apspg.com/press/060100/mram-final.html>.

Computing Unplugged (accessed Nov. 19, 2001) <http://www.research.ibm.com/thinkresearch/pages/2001/20010202_mram.shtml>.

Magnetic Tunnel Junction Materials for Electronic Applications (accessed Nov. 19, 2001) <http://www.tms.org/pubs/journals/JOM/0006/Slaughter/Slaughter-0006.html>.

Magneto–Electronics: Magnetic Tunnel Junctions (accessed Nov. 19, 2001) <http://www.almaden.ibm.com/st/projects/magneto/mtj/>.

U.S. 2002/037595, filed Mar. 2002, Hosotani.

U.S. Appl. No. 10/214,167, filed Aug. 8, 2002, Nejad, Hasan, et al.

U.S. Appl. No. 10/166,363, Jun. 11, 2002, Mirmajid, Seyyedy, et al.

* cited by examiner

STACKED 1T-NMTJ MRAM STRUCTURE

FIELD OF THE INVENTION

The present invention relates to magnetoresistive random access memo (MRAM) devices and, more particularly, to read circuitry for such devices.

BACKGROUND OF THE INVENTION

Integrated circuit designers have always sought the ideal semiconductor memory: a device that is randomly accessible, can be written or read very quickly, is non-volatile, but indefinitely alterable, and consumes little power. Magnetoresistive random access memory (MRAM) technology has been increasingly viewed as offering all these advantages.

A magnetic memory element has a structure which includes ferromagnetic layers separated by a non-magnetic barrier layer that forms a tunnel junction. Information can be stored as a digital "1" or a "0" as directions of magnetization vectors in these ferromagnetic layers. Magnetic vectors in one ferromagnetic layer are magnetically fixed or pinned, while the magnetic vectors of the other ferromagnetic layer are not fixed so that the magnetization direction is free to switch between "parallel" and "antiparallel" states relative to the pinned layer. In response to parallel and antiparallel states, the magnetic memory element represents two different resistance states, which are read by the memory circuit as either a "1" or a "0." It is the detection of these resistance states for the different magnetic orientations that allows the MRAM to read information.

There are different array architectures that are used within MRAM technology to read memory cells. For instance, one architecture used is the so-called transistor—one magnetic tunnel junction per cell ("1T-1MTJ") architecture. This structure is based on a single access transistor for controlling read access to a single magnetic memory element. Another architecture is the cross-point architecture, where the read operation is performed without using an access transistor to control individual memory cells. This type of system uses row and column lines set to predetermined voltages levels to read a selected cell. Each system has its advantages and disadvantages. The cross-point system is somewhat slower in reading than the 1T-1MTJ system, as well as being "noisy" during a read operation; however, the cross-point array has the advantage in that it can be easily stacked for higher density. Additionally, a 1T-1MTJ array is faster, but necessarily less densely integrated than a cross-point array because additional space is needed to supply the 1-to-1 access transistor to memory cell ratio.

It would be desirable to have an MRAM read architecture that could utilize advantages from both the 1T-1MTJ and cross-point architectures while minimizing the disadvantages of each.

SUMMARY

This invention provides an MRAM array read architecture which incorporates certain advantages from both cross-point and 1T-1MTJ architectures. The fast read-time and high signal-to-noise ratio of the 1T-1MTJ architecture and the higher packing density of the cross-point architecture are both exploited in the invention by uniquely combining certain characteristics of each. A single access transistor can be used to operate the reading of multiple MRAM cells, which can be stacked vertically above one another in a plurality of MRAM array layers. In this architecture, the plurality of standard MRAM cells essentially share a common sense line, though each MRAM cell can be read individually.

DETAILED DESCRIPTION

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The terms "substrate" and "wafer" can be used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over base semiconductor or foundation.

The term "metal" is intended to include not only elemental metal, but can include metal with other trace metals or in various alloyed combinations with other metals as known in the semiconductor art, as long as such alloy retains the physical and chemical properties of a metal. The term "metal" is also intended to include conductive oxide such metals.

Figure 1:
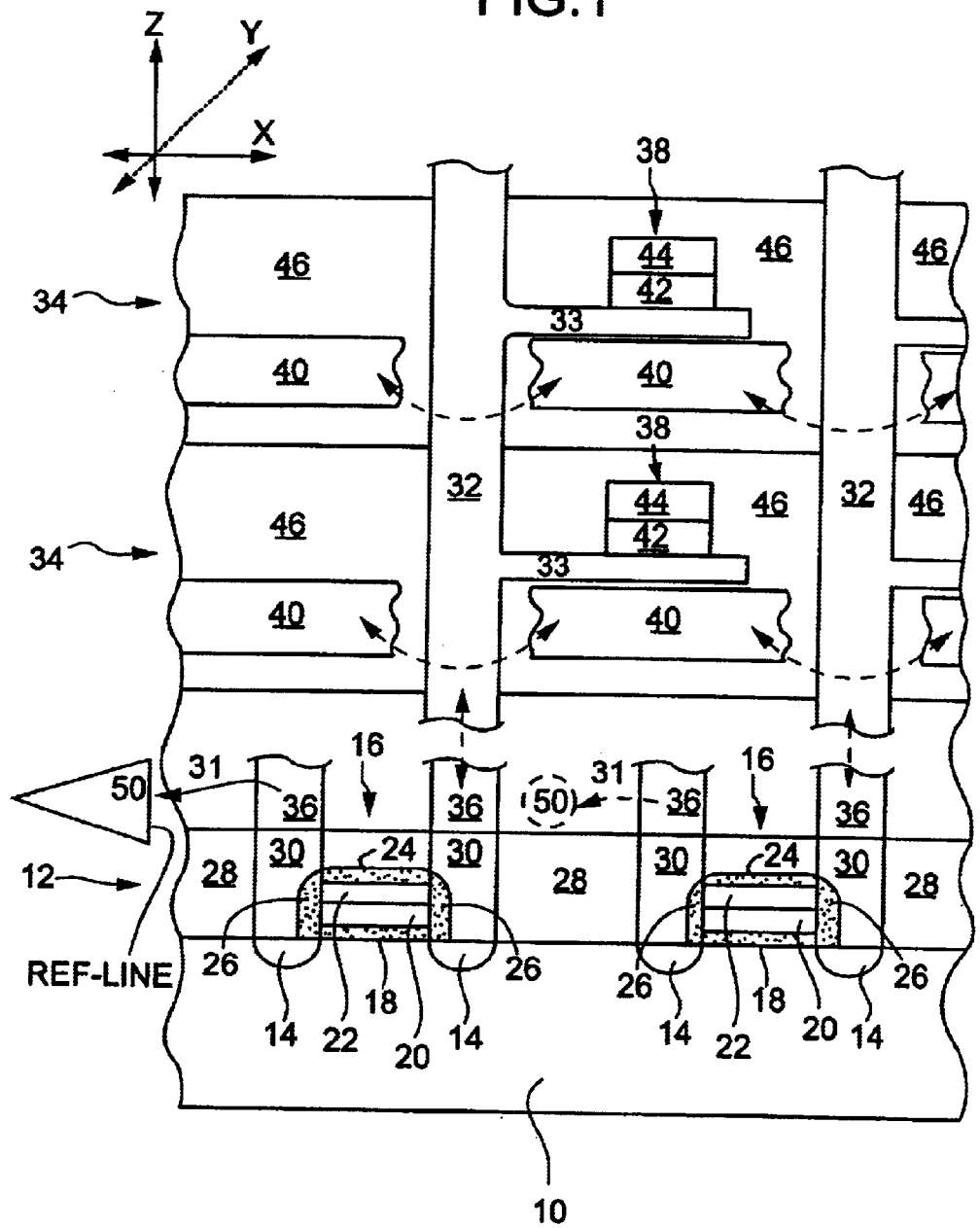
FIG. 1 is a two-dimensional cross-sectional view of a portion of an MRAM array, constructed in accordance with an exemplary embodiment of the invention.
Figure 2:
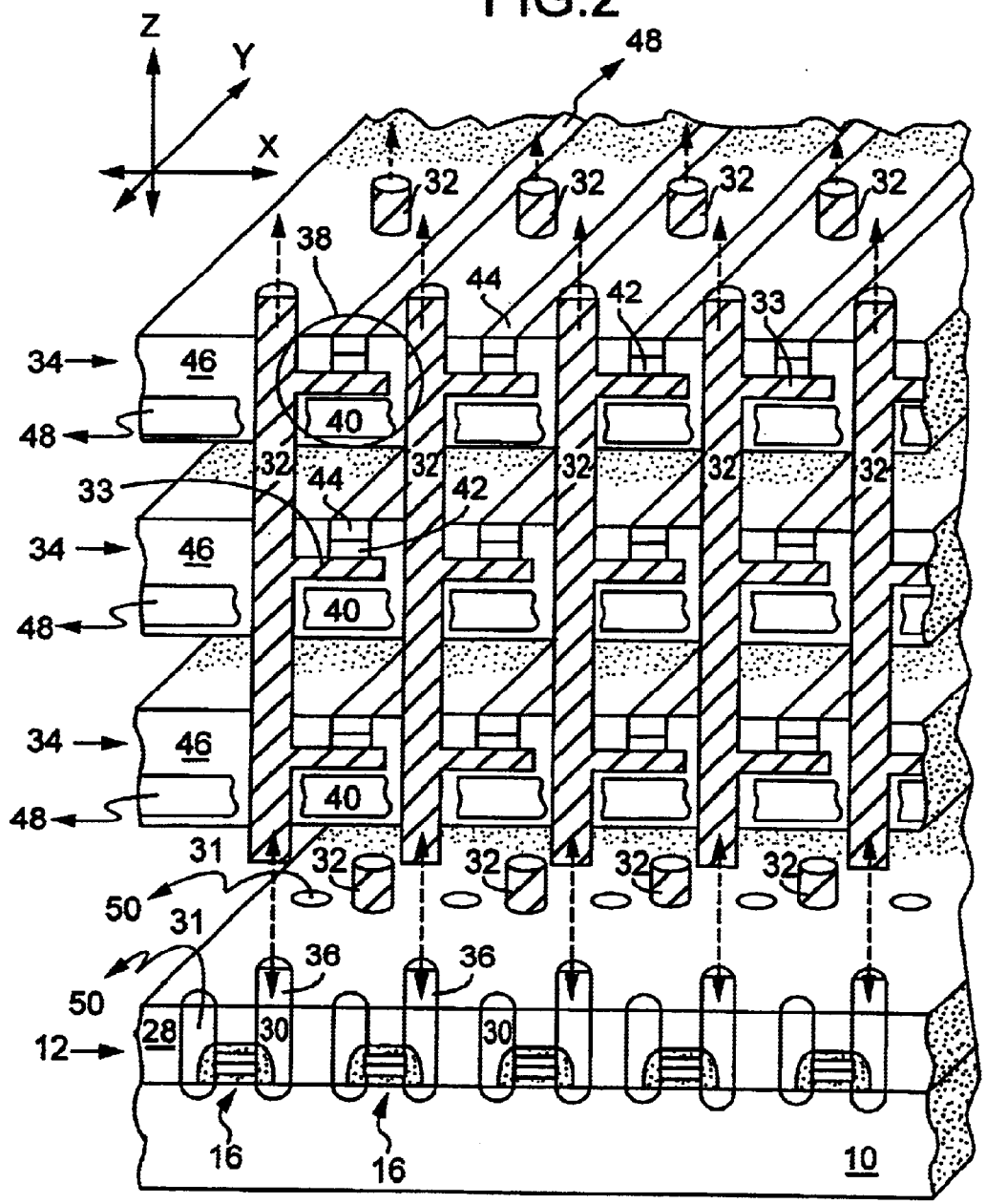
FIG. 2 is a perspective cross-sectional illustration of a portion of an MRAM array, constructed in accordance with the embodiment shown in FIG. 1.

This invention relates to MRAM technology and new variations on MRAM array architecture to incorporate certain advantages from both cross-point and 1T-1MTJ architectures. The fast read-time and high signal-to-noise ratio of the 1T-1MTJ architecture and the higher packing density of the cross-point architecture are both exploited by combining certain characteristics of each layout. FIG. 1 and FIG. 2 illustrate an exemplary embodiment of the invention. In the invention an access transistor 16 is used to control the reading of multiple MRAM cells 38, which are stacked substantially above one another in a plurality of MRAM array layers 34 that are arranged in the "Z" axis direction. In this architecture, each access transistor 16 in a two-dimensional array in the access transistor layer 12 can be connected to a substantially vertical stack of a plurality of MRAM cells 38 fabricated substantially over each single access transistor 16 so that the plurality of MRAM cells 38 in this "Z" direction will essentially share a sense line 33 by virtue of a sense line interconnect 32 (explained below). This architecture is represented in a two-dimensional cross-section in FIG. 1 and in a three-dimensional cross-section in FIG. 2. The "X," "Y," and "Z" axes are shown in both figures.

Now referring to the figures, where like reference numbers designate like elements, FIG. 1 shows that the structure of the MRAM device of the invention includes an access transistor layer 12 over a semiconductor substrate 10. The access transistor layer 12 includes at least a two-dimensional array (in the "X,Y" plane) of access transistors 16. As shown in FIG. 1, the access transistors 16 are arranged over the substrate 10 along the "X" axis direction. However, what is shown is merely a small cross-section of the MRAM device of the invention for explicative purposes and there can be other access transistors 16 over the substrate in both the "X" and "Y" axis directions.

As shown in FIG. 1, the access transistors 16 can be typical N-channel MOSFET (metal oxide semiconductor field effect transistor), though the specific structure of the access transistors 16 is not crucial to the invention. The transistors 16 include source/drain 14 active areas in the substrate 10. Over the substrate 10, the transistor 16 includes a gate oxide 18, and over this there is typically a polysilicon layer 20 with an overlying silicide layer 22, all topped by a nitride cap 24. The polysilicon layer 20 and silicide layer 22 together form a wordline 23 (that continues in the "Y" axis direction). The sides of the access transistor 16 wordline 23 are insulated and protected by insulating sidewalls 26, typically made of an oxide or nitride material. The wordline 23 of the access transistor 16 can be connected to peripheral circuitry 48 (depicted in FIG. 3), such as decoding devices and logic circuitry. Access transistors 16 for use in this invention can be fabricated by any techniques well known to those of skill in the art.

Still referring to FIG. 1, the access transistor layer 12 also includes an insulating dielectric layer 28 over and around the access transistors 16. Through this insulating dielectric layer 28 conductive plugs 30 can be fabricated to connect to the source/drain regions 14 of the access transistors 16. The insulating dielectric 28 can be any material known in the art, such as an oxide or BPSG, and can be formed according to methods well known in the art. The conductive plugs 30 similarly can be any material well known in the art, but preferably are tungsten-based, and can be formed by known methods. These conductive plugs 30 can serve as terminals or connections for electrically connecting the underlying access transistors 16 to the overlying MRAM cells 38 of the MRAM array layers 34 as well as for connection to peripheral circuitry 48, such as bit lines 31 leading to sense amplifiers 50 used during the reading of the MRAM cells 38. The connections between the access transistors 16 and the MRAM array layers 34 and the bit lines 31 are typically formed as metal interconnects 36, insulated as is known in the art with a dielectric material (not shown). The metal interconnects 36 and bit lines 31 can be copper, aluminum, or any other metal known as suitable in the art, and can be formed by known methods.

Figure 3:
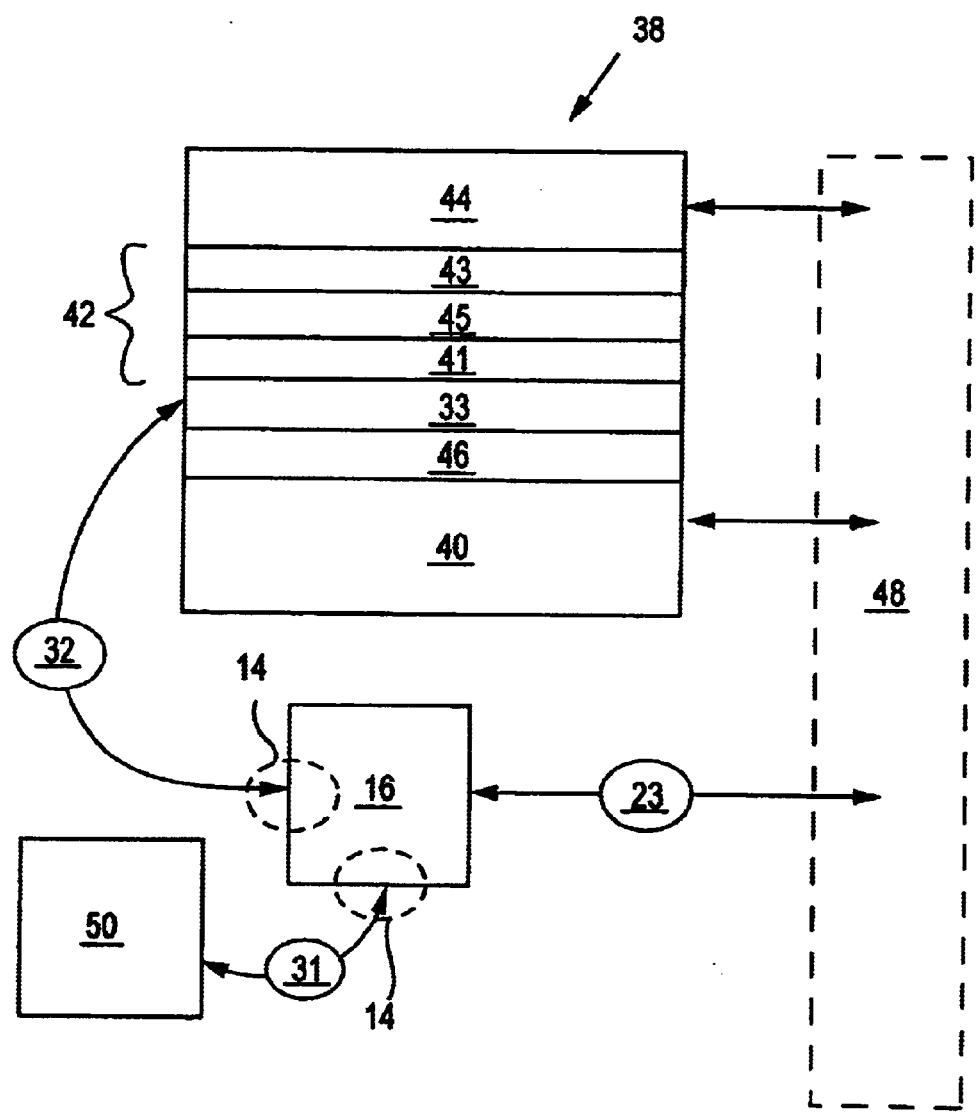
FIG. 3 is a block diagram and representational illustration of an MRAM memory cell showing the interaction between the layers of the cell and other circuitry.

As mentioned in the preceding paragraph, the bit line 31, which is connected to the sense amplifier 50, is coupled to the access transistors 16 by the metal interconnects 36 and a metal plug 30. As shown in FIG. 1, arranged in "stacked" MRAM array layers 34 are MRAM cells 38. These cells 38 are arranged in two-dimensional arrays (in the "X,Y" plane) in each layer 34, where each cell 38 is defined at the intersection of a common line 44 and a sense line 33, which can be, and generally are, orthogonal to each other. This can also be seen in a three-dimensional perspective in FIG. 2. The sense line 33 for each planar layer 34 for a given vertical stack of memory cells 38 are interconnected by a metal interconnect 32. FIGS. 1 and 2 also show write only lines 40, which may be provided to assist in writing a memory cell 38. Referring to FIG. 3, each MRAM cell 38 would include, at its most basic configuration, the common line 44 used for both the reading and writing functions, a magnetic bit 42, a sense line 33 used for the reading function, and a write-only line 40 used for the writing function, which is separated from the sense line 33 by the providing of a dielectric layer 46. The magnetic bit 42 includes a free ferromagnetic layer 43, a tunnel junction layer 45, and a pinned ferromagnetic layer 41. In the preferred embodiment, the free ferromagnetic layer 43 is above the pinned ferromagnetic layer 41, which is adjacent the sense line 33; however, it is possible to alter the arrangement of these layers as is known in the art. In the preferred embodiment, MRAM cells 38 sharing a sense line interconnect 32 are in a "column" that is vertical relative to the access transistor 16. However, other configurations are possible, such as, for instance, offsetting the cells 38 sharing the sense line interconnect 32 from one another, so long as it is practical to connect a sense line 33 of one cell 38 per layer 34 to the same sense line interconnect 32.

The write-only line 40 of the MRAM cell 38 can be composed of conductive materials as known in the art; the particular combination of materials making up the write-only line is not a critical element of the invention; however, as an example this line 40 can be copper or aluminum, for instance. The write-only line 40 is insulated from its surroundings by a dielectric layer 46, which also insulates other elements of the MRAM cell 38 and the MRAM array layer 34. Though shown in segments associated with the MRAM cells 38 in FIG. 1 and FIG. 2, the write-only lines 40 actually are continuous and travel around the sense line interconnects 32 as shown by the dashed arrows in FIG. 1.

Shown most clearly in FIG. 3, above the write-only line 40 is the sense line 33, which will be further described below, and the magnetic bit 42, which is in contact with the common line 44. The pinned ferromagnetic layer 41 includes an associated antiferromagnetic layer (not shown), such as iron manganese, which keeps the magnetic orientation of this layer 41 fixed, i.e., "pinned." The magnetic material of the pinned ferromagnetic layer 41 can be selected from many various materials or alloys with good magnetic properties, such as nickel iron cobalt or nickel iron, for instance. The tunnel junction 45 is a region separating the two ferromagnetic layers 41 and 43 and enables the storage of memory as a magnetic orientation (or combination of magnetic vectors) and resulting resistance. The tunnel junction 45 can be made of many materials, as is known in the art, but the preferred material is aluminum oxide. The tunnel junction 45 layer should be thin, smooth and consistent throughout the various MRAM cells 38, as is known in the art. Over the tunnel junction 45 is the free ferromagnetic layer 43, which can be made of the same materials having magnetic properties as the pinned ferromagnetic layer 41. As opposed to the pinned ferromagnetic layer 41, the free ferromagnetic layer 43 is free to shift its magnetic orientation for the writing of the MRAM cell 38 and has no associated antiferromagnetic layer. The free ferromagnetic layer 43 is in electrical contact with a common line 44 (read/write), substantially completing the MRAM cell 38.

Referring again to FIG. 1 and FIG. 2, multiple MRAM array layers 34 can be stacked over one another in the "Z"

axis direction, thereby increasing the density of the MRAM device. Over the uppermost MRAM array layer 34 a nitride passivation layer (not shown) will typically protect the MRAM device. There is no restrictive limit to the number of MRAM array layers 34 of the MRAM device of the invention, other than the practically of physical size of the ultimate device. In general, ten or more layers 34 are feasible. Of course, a lesser number of layers 34 can also be used.

Each MRAM cell 38 of each layer 34 has its own sense line 33, which is connected to the sense line interconnect 32, which is itself electrically connected to the access transistor 16, as shown in FIG. 1 and FIG. 2. The sense line 33 can be made of any conductive material, but is preferably tungsten-based. As shown in FIG. 1 (and FIG. 2) the sense line 33 runs above the write-only line 40, separated therefrom by the dielectric 46, and below and in contact with die magnetic bit 45 (specifically, the pinned ferromagnetic layer 41 in the preferred embodiment). In this architecture a single access transistor 16 would be shared by each of the MRAM cells 38 in the "Z" axis direction substantially above the access transistor 16, as shown in FIG. 2. That is, each access transistor 16 is serves a respective cell 38 in each of the MRAM array layers 34. FIG. 2 shows additional sense line interconnects 32 extending from the uppermost-shown surface of the MRAM array layers 34. These sense line interconnects 32 are in contact with other MRAM cells 38 and other access transistors 16 below.

FIG. 3 shows a block-diagram and a representation of an MRAM cell 38 and depicts the interactions of the cell 38 elements with associated circuitry during reading and writing of the cell 38. During the write operation an MRAM cell 38 is addressed by the coinciding stimulation of the common line 44 and a write-only line 40 of that cell 38 by peripheral circuitry, and the actual writing of memory is performed as is known in the art as a function of magnetic orientations of the ferromagnetic layers 41 and 43, the later of which should be based on the interactions of the magnetic fields of the two lines 44 and 40 caused by the electric currents in these lines 44 and 40. To read stored information in an MRAM cell 38, the cell 38 is addressed by the coinciding stimulation of a bit line 31 in contact with a sense amplifier 50, an associated access transistor 16, and the common line 44 associated with that MRAM cell 38. The cell 38 in the three-dimensional array (as shown in FIG. 2) is addressed for reading in the "X" axis direction by an access transistor 16, in the "Y" axis direction by the bit line 31 (in electrical connection with a peripheral sense amplifier 50), and in the "Z" axis direction by the common line 44 of one of the planar layers 34.

As is illustrated in FIG. 3, peripheral circuitry 48 will stimulate the wordline 23, thereby turning on the access transistor 16. When turned on, the access transistor 16 serves to connect a sense amplifier 50 (connected to the source/drain 14 of the transistor 16 by the bit line 31) to a sense line interconnect 32 (connected to the other source/drain 14 of the access transistor 16) associated with the sense lines 33 of a plurality MRAM cells 38 in the associated "Z" axis direction over that transistor 16. There can be a separate access transistor 16 (in electrical connection with a bit line 31) for each "column" of MRAM cells 38 in the "Z" axis direction through each of the MRAM array layers 34. Each of the "columns" of MRAM cells 34 can be represented by its association with a sense line interconnect 32 (FIGS. 2 and 3). When the appropriate access transistor is turned on, the cell is read when the peripheral circuitry 48 stimulates the common line 44 and a sense amplifier 50 connected to that same access transistor 16 senses the memory stored in the cell as a resistance by any method well known in the art.

The access transistors 16 can be connected to read-circuitry in various ways. For instance, each access transistor 16 can be in electrical contact with a single respective bit line 31 and that bit line 31 can be in electrical contact with a single respective sense amplifier 50 or, alternatively, multiple bit lines 31 in such an arrangement with associated respective access transistors 16 can be in electrical contact with and share a single sense amplifier 50. As another example, a plurality of access transistors 16 having different wordlines 23 can share a single bit line 31 and be in electrical contact therewith along its length. Each bit line 31 in this type of arrangement can be in electrical contact with its own respective sense amplifier 50 or, alternatively, multiple such bit lines 31 can be in electrical contact with and share a single sense amplifier 50. Additionally, regardless of the arrangement of access transistors 16, bit lines 31, and sense amplifiers 50, there can be intermediate devices (such as decoding devices) along the electrical connection between the access transistors 16 and ultimate read-circuitry, as is well known in the art.

The architecture of this invention provides for a transistor driver (the access transistor 16) for the reading function much closer to both the MRAM cell 38 and the sense amplifier 50 (or other reading device) enabling a faster read function. This produces a higher signal-to-noise ratio during the read function than would a conventional cross-point architecture. In this arrangement, the MRAM three-dimensional array essential consists of an 1T-nMTJ architecture, where n is equal to the number of MRAM array layers 34 or cells 38 in the "Z" axis direction. Accordingly, fewer access transistors 16 are required than is needed in the 1T-1MTJ architecture known in the art.

Figure 4:
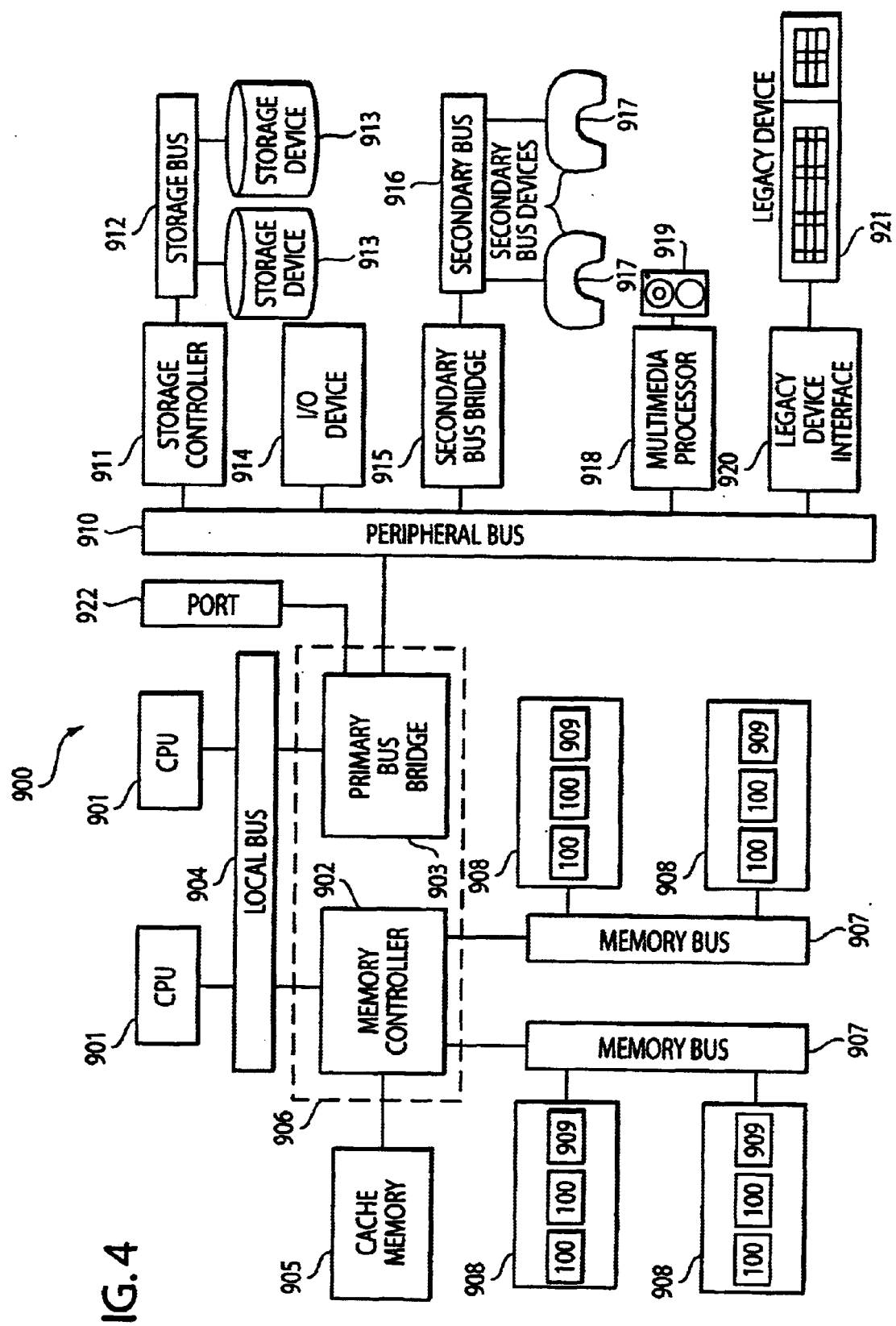
FIG. 4 is a block diagram representation of a processor-based system incorporating an MRAM device in accordance with the invention.

FIG. 4 illustrates an exemplary processing system 900 which may utilize the memory device 100 of the present invention. The processing system 900 includes on or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be an SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 4 is only an exemplary processing system with which the invention may be used. While FIG. 4 illustrates a processing architecture especially suitable for a general purpose computer, such as a personal computer or a workstation, it should be recognized that well known modification can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration plurality of devices.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A semiconductor device, comprising:
   a first access transistor;
   a plurality of first MRAM memory cells, each associated with a respective plane of a plurality of planes memory cells; and
   a plurality of first sense lines, each respectively coupled to said plurality of memory cells, said plurality of first sense lines being electrically coupled through said first access transistor to a same first bit line.

2. The semiconductor device of claim 1, wherein said planes of memory cells are arranged in a vertical stack.

3. The semiconductor device of claim 1, wherein said first MRAM memory cells each comprise a sense line, a common line, a magnetic bit, and a write-only line, wherein said common line and said sense line are orthogonal to each other.

4. The semiconductor device of claim 3, wherein said magnetic bit comprises a pinned ferromagnetic layer, a tunnel junction, and a free ferromagnetic layer.

5. The semiconductor device of claim 3, wherein one of said first MRAM memory cells is addressed during a reading function by said first bit line, said first access transistor, and said common line of said one of said first MRAM memory cells.

6. The semiconductor device of claim 5, wherein said first bit line is in electrical contact with a sense amplifier.

7. The semiconductor device of claim 1, wherein said first sense lines are in electrical contact with said access transistor by a sense line interconnect.

8. The semiconductor device of claim 7, wherein said sense lines are formed of metal.

9. The semiconductor device of claim 8, wherein said metal comprises tungsten.

10. The semiconductor device of claim 1, further comprising:
    a second access transistor;
    a plurality of second MRAM memory cells, each associated with one said respective plane of memory cells; and
    a plurality of second sense lines, each respectively coupled to said plurality of second MRAM memory cells, said plurality of second sense lines being electrically coupled through said second access transistor to a same second bit line.

11. A semiconductor device, comprising:
    an access transistor layer comprising a plurality of access transistors each in electrical contact with a respective bit line;
    a plurality of memory array layers, each provided vertically over said access transistor layer, said memory array layers comprising a plurality of MRAM memory cells and a respective a sense line for each of said plurality of MRAM memory cells, said MRAM memory cells being arranged within the array layers to define sets of MRAM memory cells in a direction perpendicular to a planar direction of said array layers; and
    a plurality of sense line interconnects, wherein each said sense line interconnect is in electrical contact with a respective access transistor of said plurality of access transistors and with one said sense line of each of said memory array layers.

12. The semiconductor device of claim 11, wherein when said respective access transistor of said plurality of access transistors is turned on, said respective bit line in electrical contact with said respective access transistor is electrically connected to one said sense line interconnect and any said sense line in electrical contact with that one said sense line interconnect.

13. The semiconductor device of claim 11, wherein each said MRAM memory cell comprises a write-only line, pinned ferromagnetic layer, a tunnel junction, a free ferromagnetic layer, and a common line.

14. The semiconductor device of claim 13, wherein at least one of said MRAM memory cells is addressed for a reading function by said respective access transistor, said respective bit line in electrical contact with said respective access transistor, and said common line of said at least one of MRAM memory cells.

15. The semiconductor device of claim 11, wherein said sense lines comprise a metal.

16. The semiconductor device of claim 15, wherein said metal comprises tungsten.

17. The semiconductor device of claim 11, wherein said respective bit line in electrical contact with said access transistor is also in contact with a sense amplifier.

18. The semiconductor device of claim 11, wherein each one said sense line is in electrical contact with a sense amplifier.

19. A memory device, comprising:
a first memory array layer comprising a first MRAM memory cell, said first MRAM memory cell being associated with a first sense line;
a second memory array layer over said first memory array layer and comprising a second MRAM memory cell, wherein said second MRAM memory cell is located above said first MRAM memory cell and is associated with a second sense line; and
an access transistor layer comprising a first access transistor, said first access transistor, when turned on, coupling a first bit line with said first and second sense lines.

20. The memory device of claim 19, wherein said first and second sense lines are in electrical contact with said first access transistor through a first sense line interconnect.

21. The memory device of claim 19, wherein said first and second sense lines are formed of a metal.

22. The memory device of claim 21, wherein said metal comprises tungsten.

23. The memory device of claim 19, wherein each of said first and second MRAM memory cells each comprise one of said sense lines, a respective common line, a respective magnetic bit, and a respective write-only line.

24. The memory device of claim 23, wherein one of said first and second MRAM memory cells is addressed during a read function by a respective common line, said first access transistor, and said first bit line.

25. The memory device of claim 19, further comprising a plurality of third memory array layers over said second memory array layer, each of said plurality of third memory array layers comprising a third MRAM memory cell, each said third MRAM memory cell is located above said first and second MRAM memory cells and is associated with a third sense line, said third sense line being in electrical contact with said first access transistor.

26. The memory device of claim 25, wherein said first, second, and third sense lines are in electrical contact with said first access transistor through a first sense line interconnect.

27. The memory device of claim 25, wherein said first, second, and third sense lines are formed of a metal.

28. The memory device of claim 27, wherein said metal comprises tungsten.

29. The memory device of claim 25, wherein each of said first, second, and third MRAM memory cells comprise a respective common line, one of said sense lines, a respective magnetic bit, and a respective write-only line.

30. The memory device of claim 29, wherein one of said first, second, and third MRAM memory cells is addressed during a read function by said respective common line, said first access transistor, and said first bit line.

31. The memory device of claim 25, wherein said access transistor layer comprises a plurality of second access transistors.

32. The memory device of claim 31, wherein each of said first memory array layer, said second memory array layer, and said plurality of third memory array layers comprise a fourth MRAM memory cell, wherein each said fourth MRAM memory cell comprises a fourth sense line in electrical contact with said second access transistor through a second sense line interconnect.

33. A semiconductor device, comprising:
a first access transistor layer comprising a plurality of access transistors;
a first memory array layer comprising a plurality of first MRAM memory cells, each of said plurality of first MRAM memory cells being defined at one of a plurality of first intersection points of a plurality of first common lines and a plurality of first sense lines;
a second memory array layer provided over said first memory array layer, comprising a plurality of second MRAM memory cells, each of said plurality of second MRAM memory cells being defined at one of a plurality of second intersection points of a plurality of second common lines and a plurality of second sense lines; and
a plurality of sense line interconnects, each one of said plurality of sense line interconnects being in electrical contact with the respective first sense line, the respective second sense line, and with one of said plurality of first access transistors.

34. An MRAM read architecture, comprising:
an access transistor;
a series of n magnetic bits each having a magnetic tunnel junction and being associated with a respective sense line, said series of n magnetic bits being in a substantially columnar stack over said access transistor, n being equal to or greater than 2; and
an interconnect in electrical contact with each said respective sense line of said series of n magnetic bits and with said access transistor.

35. A processor system, comprising:
a processor; and
an MRAM memory circuit, comprising:
a first memory array layer comprising a first MRAM memory cell, said first MRAM memory cell being associated with a first sense line;
a second memory array layer over said first memory array layer and comprising a second MRAM memory cell, wherein said second MRAM memory cell is located above said first MRAM memory cell and is associated with a second sense line; and
an access transistor layer comprising a first access transistor, said first access transistor, when turned on, coupling a first bit line with said first and second sense lines.

36. The processor system of claim 35, wherein said first and second sense lines are in electrical contact with said first access transistor through a first sense line interconnect.

37. The processor system of claim 35, wherein said first and second sense lines are formed of a metal.

38. The processor system of claim 37, wherein said metal comprises tungsten.

39. The processor system of claim 35, wherein each of said first and second MRAM memory cells each comprise one of said sense lines, a respective common line, a respective magnetic bit, and a respective write-only line.

40. The processor system of claim 39, wherein one of said first and second MRAM memory cells is addressed during a read function by a respective common line, said first access transistor, and said first bit line.

41. The processor system of claim 35, further comprising a plurality of third memory array layers over said second memory array layer, each of said plurality of third memory array layers comprising a third MRAM memory cell, each said third MRAM memory cell is located above said first and second MRAM memory cells and is associated with a third sense line, said third sense line being in electrical contact with said first access transistor.

42. The processor system of claim 41, wherein said first, second, and third sense lines are in electrical contact with said first access transistor through a first sense line interconnect.

43. The processor system of claim 41, wherein said first, second, and third sense lines are formed of a metal.

44. The processor system of claim 43, wherein said metal comprises tungsten.

45. The processor system of claim 41, wherein each of said first, second, and third MRAM memory cells comprise a respective common line, one of said sense lines, a respective magnetic bit, and a respective write-only line.

46. The processor system of claim 45, wherein one of said first, second, and third MRAM memory cells is addressed during a read function by said respective common line, said first access transistor, and said first bit line.

47. The processor system of claim 41, wherein said access transistor layer comprises a plurality of second access transistors.

48. The processor system of claim 47, wherein each of said first memory array layer, said second memory array layer, and said plurality of third memory array layers comprise a fourth MRAM memory cell, wherein each said fourth MRAM memory cell comprises a fourth sense line in electrical contact with said second access transistor through a second sense line interconnect.

49. A method of forming an MRAM device, comprising:

providing a sense amplifier;

providing an interconnect;

providing an access transistor capable of electrically connecting said sense amplifier and said interconnect;

providing n array planes over said access transistor, each of said n array planes comprising at least one MRAM memory cell, said at least one MRAM memory cell comprising a common line, wherein n is equal to 2 or greater; and providing a plurality of sense lines, each associated with a respective said at least one MRAM memory cell of said n array planes and being in electrical contact with said interconnect.

* * * * *

UNITED STATES PATENT AND TRADEMARK OFFICE
CERTIFICATE OF CORRECTION

PATENT NO. : 6,940,748 B2
DATED : September 6, 2005
INVENTOR(S) : Hasan Nejad et al.

It is certified that error appears in the above-identified patent and that said Letters Patent is hereby corrected as shown below:

Column 1,
Line 35, "so-called transistor" should read -- so-called one transistor --;

Column 2,
Line 49, "oxide such" should read -- oxides of such --;

Column 5,
Line 22, "16 is serves" should read -- 16 serves --;

Column 6,
Line 35, "includes on or" should read -- includes one or --;
Line 58, "include" should read -- includes --;

Column 7,
Line 4, "also coupled" should read -- also be coupled --;
Line 14, "an local" should read -- a local --;
Line 22, "to one" should read -- to --;
Line 31, "modification" should read -- modifications --; and
Line 40, "system" should read -- systems --;

Column 8,
Line 44, "respective a sense" should read -- respective sense --.

Signed and Sealed this

Twenty-ninth Day of November, 2005

JON W. DUDAS
*Director of the United States Patent and Trademark Office*